(12) United States Patent
Rudin

(10) Patent No.: US 8,604,604 B2
(45) Date of Patent: Dec. 10, 2013

(54) CONDUCTIVE INTERCONNECTS

(75) Inventor: John Christopher Rudin, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 822 days.

(21) Appl. No.: 12/273,777

(22) Filed: Nov. 19, 2008

(65) Prior Publication Data

US 2009/0146193 A1 Jun. 11, 2009

(30) Foreign Application Priority Data

Nov. 19, 2007 (GB) .................................. 0722613.7

(51) Int. Cl.
*H01L 23/04* (2006.01)
(52) U.S. Cl.
USPC ........... 257/698; 257/288; 257/330; 257/774; 257/E29.117; 438/149; 438/151; 438/197; 438/674; 438/675
(58) Field of Classification Search
USPC .......... 257/228, 330, E27.111, 288, 698, 774, 257/E29.117; 438/197, 149, 151, 674, 675
See application file for complete search history.

(56) References Cited

U.S. PATENT DOCUMENTS

| | | | | |
|---|---|---|---|---|
| 4,661,374 A | * | 4/1987 | Doering | 438/303 |
| 5,372,871 A | * | 12/1994 | Takase et al. | 428/209 |
| 5,576,556 A | * | 11/1996 | Takemura et al. | 257/69 |
| 6,277,679 B1 | * | 8/2001 | Ohtani | 438/151 |
| 6,555,411 B1 | | 4/2003 | Bao et al. | |
| 7,053,459 B2 | * | 5/2006 | Yamamoto et al. | 257/519 |
| 2004/0113161 A1 | * | 6/2004 | Suzuki et al. | 257/83 |
| 2006/0226420 A1 | * | 10/2006 | Nanai et al. | 257/40 |

FOREIGN PATENT DOCUMENTS

| | | |
|---|---|---|
| GB | 2212659 A | 7/1989 |
| GB | 2438697 A | 5/2007 |
| WO | 2005/009095 A1 | 1/2005 |

OTHER PUBLICATIONS

Search Report dated Mar. 17, 2008 in related co-pending GB application No. 0722613.7 (3 Pages).

* cited by examiner

*Primary Examiner* — Kenneth Parker
*Assistant Examiner* — John Lin

(57) ABSTRACT

A method of making a conductive interconnect structure includes the steps of: electrodepositing a metal on a conductive surface (4) of a carrier (2) to form a first elongate conductive interconnect (12); and electrodepositing a dielectric material (14) on said conductive interconnect (12) while the conductive interconnect (12) is in contact with the conductive surface (4).

19 Claims, 12 Drawing Sheets

CONDUCTIVE INTERCONNECTS

RELATED APPLICATIONS

The present application is based on, and claims priority from, United Kingdom Application Number 0722613.7, filed Nov. 19, 2007, the disclosure of which is hereby incorporated by reference herein in its entirety.

FIELD OF THE INVENTION

The present invention relates to conductive interconnects.

BACKGROUND TO THE INVENTION

Displays which are based on electro-optical effects such as LCDs, OLEDs, and electrophoretic displays are often addressed using an array of 'active' devices. These provide a non-linear disconnection between the matrixing of the information and the electric field or current at each pixel. Typically a thin film transistor (TFT) is used such that its gate is controlled in parallel with all other devices on a particular row, and its source is provided by a data driver connected to each column. The drain is connected to the pixel driving electrode and optionally a capacitor to provide an effective 'sample and hold' of the data voltage. When arranged as a large row and column matrix a full image display can be effected. In a matrix there is the additional complication that the source lines must cross the gate lines (or vice versa) either at the device, or independently.

International patent applications WO2005/008744 and WO2005/009095 describe a technique which is based on the electroforming of all of the metal contacts and connections to a TFT device and the formation by 'overgrown' electrodeposition of crossover features. The second layer dielectric, which forms either the gate layer dielectric or the crossover dielectric, is formed by photo- or laser-patterning of a suitable polymer material.

SUMMARY OF THE INVENTION

Aspects of the invention are specified in the independent claims. Preferred features are specified in the dependent claims.

The electrodeposited dielectric may form the gate dielectric of a semiconductor device, for example a TFT. In this case, a semiconductor will be formed between the metal structures. Alternatively it may serve as a crossover dielectric to separate electrical interconnects. In this case, the metal deposition will be continued to form a bridge between the metal structures. The metal structures and the bridge will form a single integrated second elongate conductive interconnect which is separate from the first interconnect. Thus, the bridge may be formed between the metal structures without any intervening seed layer or the need for any other intermediate layer such as a copper blanket.

After forming the semiconductor or the metal bridge, the structure may be laminated to a substrate and the carrier peeled off.

By electrodepositing the dielectric material on the first interconnect, the dielectric is self-aligned to the underlying conductor, with the shape and position of both the metal conductor and the overlying electrodeposited dielectric material determined by the trench defined by the original multilevel dielectric structure. This avoids problems with previous techniques such as photo- or laser patterning of a polymer material, which require a certain level of pattern re-alignment that may cause practical difficulties and cost when applied to large area polymer substrates because of dimensional instability.

The technique of electrodepositing the gate or crossover dielectric may produce a continuous film without pinhole or other defects which would effect a short between the gate and source/drain (in a TFT) or between conductor A and conductor B in a crossover, potentially increasing the manufacturing yield of the process.

Electrodeposited metal has a characteristic grain structure which can be measured. Moreover, as discussed in "Modern Electroplating" $4^{th}$ Ed., Schlesinger & Paunovic Eds Wiley 2000, electroplated films almost always contain various types of inclusions or impurities. Electrodeposited metals can therefore be differentiated, both structurally and by composition, from metals deposited by other techniques. Similarly, electrodeposited dielectric material is believed to be structurally and/or compositionally distinguishable from dielectric material deposited by other techniques.

The terms 'electrodepositing' and 'electroplating' are synonymous.

BRIEF DESCRIPTION OF THE DRAWINGS

The invention will now be further described, by way of example only, with reference to the following drawings in which.

DETAILED DESCRIPTION

Figure 1A:
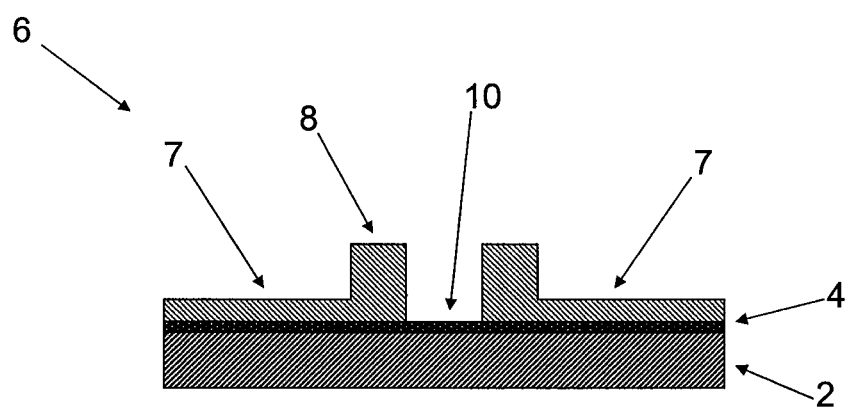
FIGS. 1a through 1e depict stages in the manufacture of a conductive interconnect in accordance with an embodiment of the present invention.

Referring to FIG. 1a a carrier 2, for example a film of a plastics material, has a conductive surface 4. A multilevel dielectric structure 6 is formed on the conductive surface 4, for example by photolithography using a material such as SU8, or by UV micromoulding. The dielectric structure 6 includes a pair of upstanding walls 8 which define a trench 10 between them, and regions of dielectric material 7 outside the trench 10 and adjacent to the walls 8. The base of the trench 10 comprises part of the conductive surface 4 between the walls 8. If UV micromoulding is used to form the dielectric structure 6, then the base of the trench 10 may be cleared of any residue by plasma, or UV ozone ashing to ensure that it is presents a conductive surface.

Figure 1B:
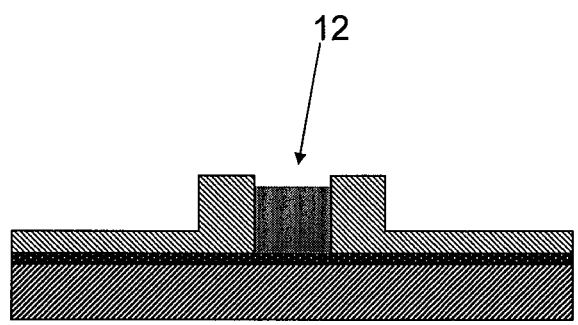

In FIG. 1b, the carrier is placed in a standard electroforming system, where the conductive layer 4 forms the cathode. A metal (typically nickel, gold, copper or a combination thereof is deposited to form a first conductive interconnect 12 in the trench 10.

Following deposition of the first conductive interconnect 12 (FIG. 1c), a polymer dielectric material 14 is electrodeposited onto the exposed metal surface of the first conductive interconnect 12. e.g electrodeposited UV curable photoresist Eagle 2100 from Shipley, or thermally cured resin Lugalvan EDC from BASF. This is typically an emulsion of resin micelles which carry a charge and are electrophoretically deposited onto the metal surface, where they coalesce and form a thin continuous layer. This material is cured by UV exposure and/or thermal baking in accordance with manufacturer's instructions.

Figure 1C:
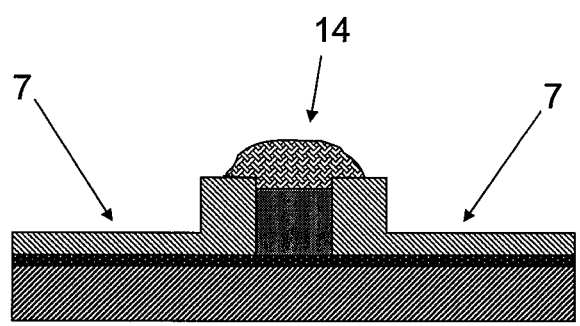
Figure 1D:
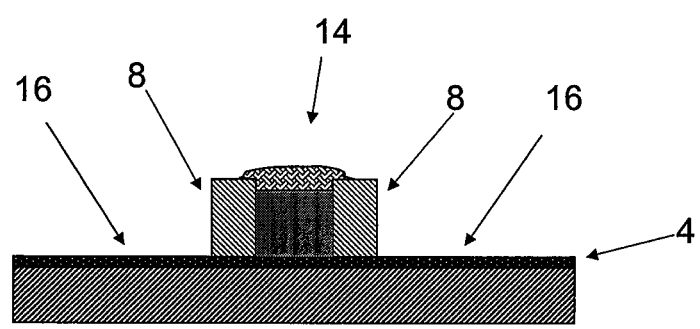

Referring now to FIG. 1d, the structure of FIG. 1c is etched back, for example by oxygen plasma, UV-ozone or Excimer lamp. This removes the first, thin, level 7 of the multilevel dielectric structure 6, which is much closer to the conductive surface 4 than are the tops of the walls 8, and uncovers parts 16 of the conductive surface 4 adjacent to the outer faces of the walls 8. There will be some removal of the electrodeposited dielectric 14, but this can be pre-compensated by the electrodeposition of sufficient material. Preferably the electrodeposited dielectric 14 has a low etch rate compared to the material forming the initial multilevel dielectric structure 6.

Figure 1E:
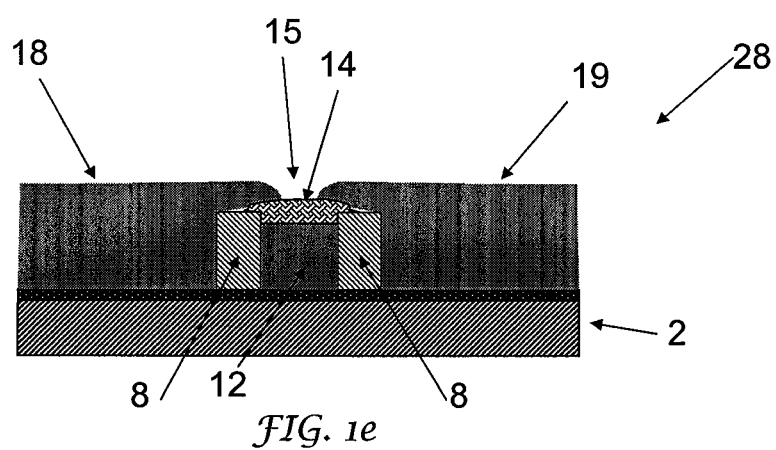

Electroplating of the exposed areas 16 is then carried out in an isotropic manner so that first and second electrodeposited metal structures 18, 19 are formed adjacent to the outer surfaces of the walls 8 and overlapping the tops of the walls 8 and the edges of the first conductive interconnect 12 to produce the conductive interconnect structure 28 shown in FIG. 1e. This structure 28 may be used to form a TFT or a crossover as described below.

Figure 2A:
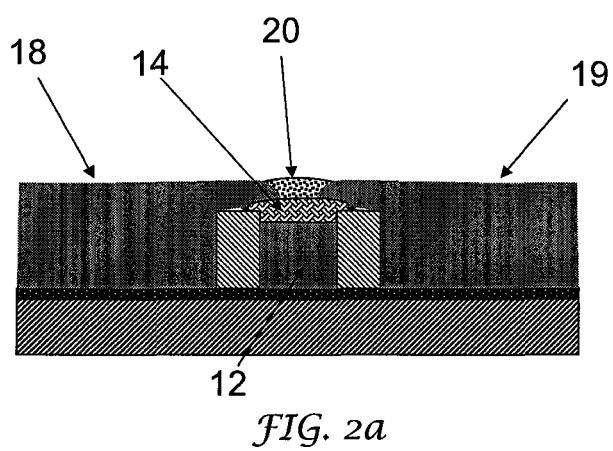
FIGS. 2a through 2c depict stages in the manufacture of a TFT from the interconnect of FIG. 1, in accordance with another embodiment of the invention.
Figure 2B:
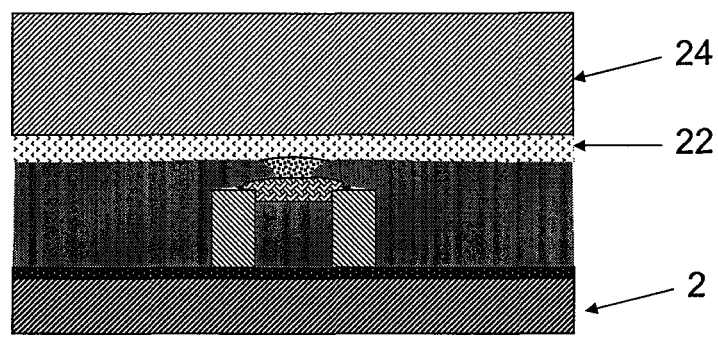
Figure 2C:
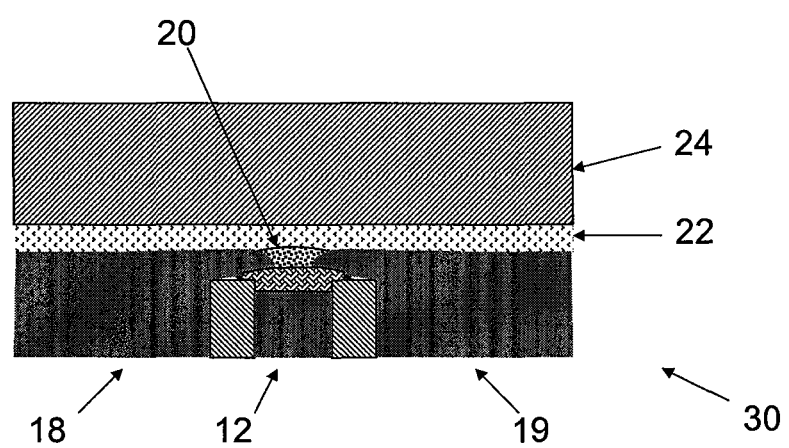

Referring now to FIG. 2, steps in the manufacture of a TFT 30 are shown. The structure 28 has a channel 15 defined by the first and second electrodeposited metal structures 18, 19 and the electrodeposited dielectric 14. A semiconductor material 20 is deposited and dried, cured and/or annealed in the channel 15 (FIG. 2a) after which a plastic substrate 24 is laminated on the semiconductor 20 and metal structures 18, 19 using a conformal adhesive layer 22 (FIG. 2b). Finally, the carrier 2 (with its conductive surface 4) is peeled off to leave the TFT 30 shown in FIG. 2c. In this example, the first metal structure 18 comprises the source electrode and the second metal structure 19 comprises the drain electrode, although this arrangement could of course be reversed. The first conductive interconnect 12 functions as the gate electrode.

Figure 3A:
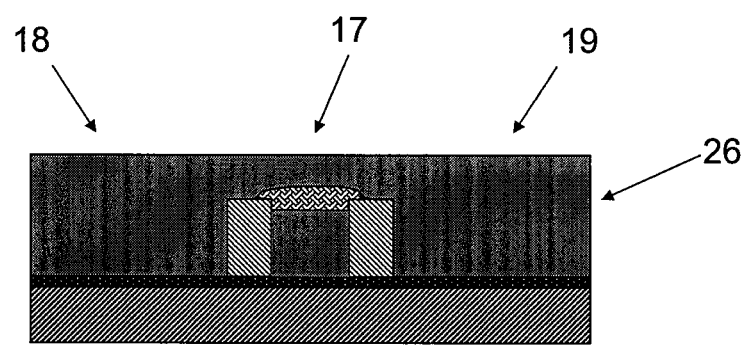
FIGS. 3a through 3c show a crossover formed from the conductive interconnect of FIG. 1, in accordance with a further embodiment of the invention.

To manufacture a crossover of conductive interconnects from the structure 28, the isotropic electroplating is continued until the lateral growth of the metal forms a conductive bridge 17 over the electrodeposited dielectric 14 (FIG. 3a). The conductive bridge 17, the first metal structure 18 and the second metal structure 19 are formed as a single integrated metal track which forms the second elongate conductive interconnect 30. The first 12 and second 30 conductive interconnects are electrically isolated from each other by the walls 8 and the electrodeposited dielectric material 14.

Figure 3B:
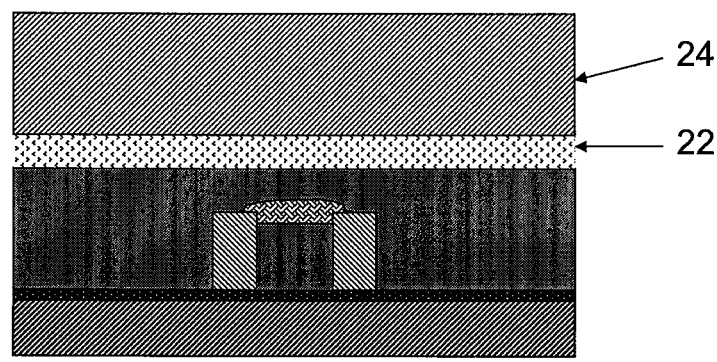
Figure 3C:
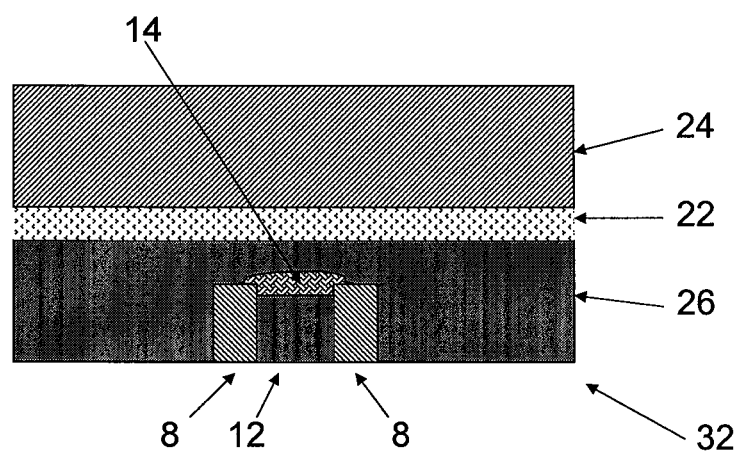

The circuit of FIG. 3a is then adhesively transferred onto a substrate 24 (FIGS. 3b, 3c) using the same lamination and peel techniques as described for FIGS. 2b and 2c to provide the crossover 32.

No processing is required on the final substrate 24, which may be made of a plastic material and susceptible to damage.

Figure 4:
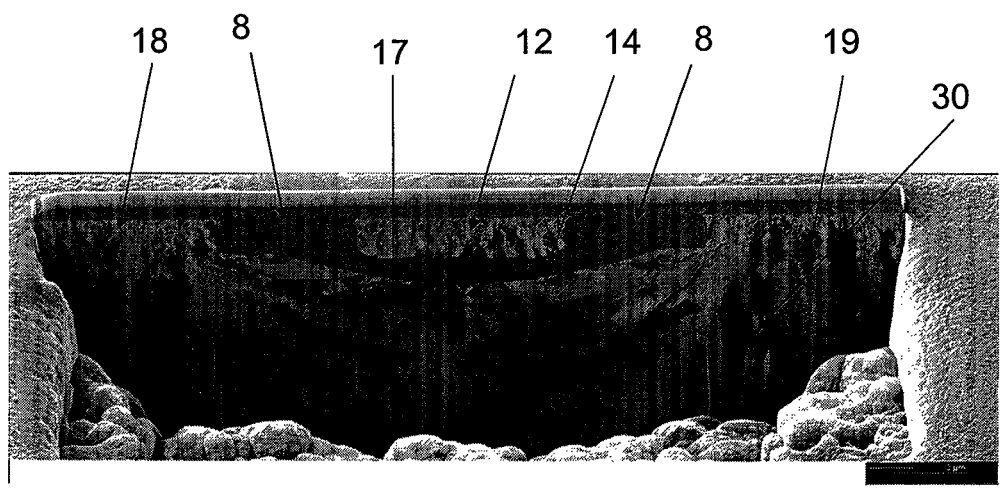
FIG. 4 is a FIB-SEM picture of a crossover made in accordance with an embodiment of the invention.

A specific example of a crossover of conductive interconnects is shown in FIB-SEM cross-section FIG. 4. In this case a nickel coated glass substrate was used as the conductive surface. A multilevel pattern of dielectric was formed by repeated photolithography of photocurable epoxy SU8 (MCC Corp). The substrate was connected as the cathode in a nickel sulphamate based electrolytic plating system, with a titanium anode electrode. Nickel was electro-deposited into the channel 10 to form the first elongate conductor 12 using suitable plating waveforms. The conductive surface was then immersed in a bath containing Shipley Eagle SP2100 electrodepositable photoresist and connected as the anode, a stainless steel cathode plate was introduced and approximately 3 μm of resist was deposited. The conductive substrate was removed, rinsed using water, dried and exposed to UV illumination (15 mW/cm² for 3 minutes). The conductive surface was then baked at 120° C. for 1 hour to cure the resin to form the dielectric layer 14. The dielectric 7 was etched back to reveal the conductive surface by oxygen plasma ashing at 200 W for 5 minutes. The conductive surface was reintroduced to the nickel sulphamate plating system and reconnected as a cathode. Nickel was electrodeposited using suitable waveforms to form metal structures 18 and 19, and continued to form the conductive bridge 17. Isotropic plating was achieved by use of pulse plating waveforms without modification to the electrolyte chemistry. After electrodeposition the conductive surface was rinsed and dried and coated with an optically clear UV curable adhesive (NOA81—Norland Optical) and a final substrate of PET (ST506—Dupont Teijin Films) was laminated using a suitable rubber roller. The adhesive layer was cured by exposure to UV illumination (15 mW/cm² for 3 minutes) followed by thermal baking at 120° C. for 30 minutes. The conductive surface was then removed by peeling off the final structure 32 on the final substrate 24.

Although the invention has been illustrated with reference to the manufacture of a single TFT or crossover, it will be understood that it is not limited to these embodiments. In particular, the techniques of the present invention are suitable for large area fabrication of TFT arrays or arrays including a plurality of crossovers of elongate conductive interconnects.

The articles 'a' and 'an' are used herein to denote 'at least one' unless the context otherwise requires.

The invention claimed is:

1. A method of making a conductive interconnect structure comprising:
   (a) forming on a conductor forming a conductive surface on a carrier, a dielectric structure including:
      (i) first and second walls which define a trench therebetween, the trench having a base comprising part of the conductive surface of the carrier; and
      (ii) regions of dielectric material outside the trench and adjacent to the walls: the tops of the walls being disposed farther from the conductive surface than said adjacent regions;
   (b) electrodepositing a metal in the trench; and
   (c) electrodepositing a dielectric photoresist material in the trench, on top of said metal.

2. A method according to claim 1, further comprising:
   (d) removing at least a part of the dielectric material in each of the regions adjacent to the walls, to expose parts of the conductive surface; and
   (e) depositing metal on the exposed conductive surfaces to form metal structures adjacent to said walls.

3. A method according to claim 2, further comprising:
   (f) forming a semiconductor on the electrodeposited dielectric material and between said metal structures.

4. A method according to claim 3, wherein the interconnect structure is a thin film transistor (TFT), the method further comprising the steps of:
   (g) laminating a substrate over the semiconductor and the metal structures; and
   (h) removing the carrier.

5. A method according to claim 2, further comprising:
   (f) continuing to deposit metal to form a metal bridge between the metal structures, the metal structures and metal bridge comprising a second elongate conductive interconnect which is separate from and crosses the first electrical interconnect.

6. A method according to claim 5, wherein the interconnect structure is a crossover, the method further comprising the steps of:

(g) laminating a substrate over the second elongate conductive interconnect; and (h) removing the carrier.

7. A method according to claim 1, wherein the step of electrodepositing a dielectric material comprises applying an emulsion of resin micelles which carry a charge, and electrophoretically depositing the micelles onto the metal surface so that they coalesce and form a continuous layer, followed by curing said layer.

8. A conductive interconnect structure suitable for use in making a thin film transistor or a crossover of conductive interconnects, the structure comprising:

(a) a carrier with a conductive surface formed by a metal layer on said carrier;

(b) a dielectric structure on the conductive surface, the dielectric structure including:

(i) first and second walls which define a trench therebetween, in which the conductive surface forms a bottom of the trench, in which the metal layer is configured to serve as an electrode in an electrodeposition process;

(c) an electrodeposited metal in the trench on the conductive surface by applying an electro-deposition current to the metal layer; and (d) an electrodeposited dielectric material in the trench, on top of the metal layer.

9. The structure of claim 8, further comprising a source electrode, a drain electrode and a gate electrode, wherein said gate electrode comprises said metal deposited in the trench.

10. The structure of claim 8, further comprising metal structures disposed adjacent to outer surfaces of the walls and overlapping tops of the walls, said metal structures being a source electrode and a drain electrode.

11. The structure of claim 8, further comprising regions of dielectric material outside the trench and adjacent to the walls, wherein tops of the walls are disposed farther from the conductive surface than said adjacent regions; wherein the regions of dielectric material outside the trench are removed prior to deposition of a source electrode and a drain electrode adjacent to outer surfaces of the walls and overlapping tops of the walls.

12. The structure of claim 8, in which the carrier and metal layer comprise a nickel coated glass substrate.

13. The structure of claim 8, in which the metal layer is a sacrificial metal layer to be removed from the structure after the electrodeposited metal is deposited in the trench.

14. A thin film transistor (TFT) including a semiconductor material, an electrodeposited gate electrode and an electrodeposited gate dielectric disposed between the semiconductor material and the gate electrode, wherein the electrodeposited gate dielectric comprises a thermal or photocurable resin and wherein the electrodeposited gate dielectric is directly connected to the electrodeposited gate electrode without any intervening non-electrodeposited seed layer.

15. The TFT according to claim 14, wherein said TFT comprises:

a substrate with a metal layer thereon;

a dielectric structure on the metal layer conductor, the dielectric structure including first and second walls which define a trench therebetween, the trench having a base comprising the metal layer; and wherein said gate electrode and said gate dielectric are disposed in said trench.

16. A conductive interconnect structure suitable for use in making a thin film transistor or a crossover of conductive interconnects, the structure comprising:

(a) a carrier with a conductive surface;

(b) a dielectric structure on the conductive surface, the dielectric structure including:

(i) first and second walls which define a trench therebetween, the trench having a base comprising part of the conductive surface of the carrier; and (c) an electrodeposited metal in the trench; and (d) an electrodeposited dielectric material in the trench, on top of the metal;

wherein the electrodeposited dielectric material in the trench, on top of the metal comprises a curable photoresist.

17. The structure of claim 16, wherein the curable photoresist is an ultraviolet curable material.

18. The structure of claim 17, wherein the curable photoresist comprises an emulsion of resin micelles that carry a charge.

19. A conductive interconnect structure comprising:

a dielectric structure comprising first and second walls which define a trench therebetween;

a first electrodeposited metal structure in the trench to form a first conductive interconnect;

an electrodeposited dielectric material in the trench, on top of the electrodeposited metal; wherein the electrodeposited dielectric material comprises a curable polymer; and a second electrodeposited metal structure deposited over the electrodeposited dielectric material to form an second conductive interconnect, wherein the second conductive interconnect is electrically isolated from the first conductive interconnect by the first and second walls and the electrodeposited dielectric material, wherein the second conductive interconnects crosses over the first conductive interconnect.

* * * * *

UNITED STATES PATENT AND TRADEMARK OFFICE
CERTIFICATE OF CORRECTION

PATENT NO. : 8,604,604 B2  
APPLICATION NO. : 12/273777  
DATED : December 10, 2013  
INVENTOR(S) : John Christopher Rudin Page 1 of 1

It is certified that error appears in the above-identified patent and that said Letters Patent is hereby corrected as shown below:

In the Claims:

In column 5, lines 6-7, in Claim 7, delete "electrophoretic ally" and insert -- electrophoretically --, therefor.

In column 6, line 7, in Claim 15, delete "layer conductor," and insert -- layer, --, therefor.

Signed and Sealed this
Fifteenth Day of April, 2014

Michelle K. Lee
*Deputy Director of the United States Patent and Trademark Office*